United States Patent [19]

Wu

[11] Patent Number: 5,856,226
[45] Date of Patent: Jan. 5, 1999

[54] METHOD OF MAKING ULTRA-SHORT CHANNEL MOSFET WITH SELF-ALIGNED SILICIDED CONTACT AND EXTENDED S/D JUNCTION

[75] Inventor: Shye-Lin Wu, Hsinchu, Taiwan

[73] Assignee: Texas Instruments-Acer Incorporated, Hsinchu, Taiwan

[21] Appl. No.: 994,053

[22] Filed: Dec. 19, 1997

[51] Int. Cl.⁶ .................... H01L 21/336; H01L 21/3205; H01L 21/4763
[52] U.S. Cl. .................. 438/291; 438/305; 438/592; 438/520; 438/769
[58] Field of Search .................................. 438/291, 305, 438/592, 520, 521, 769

[56] References Cited

U.S. PATENT DOCUMENTS

| | | |
|---|---|---|
| 5,082,794 | 1/1992 | Pfiester et al. . |
| 5,270,234 | 12/1993 | Huang et al. . |
| 5,434,093 | 7/1995 | Chau et al. . |
| 5,472,897 | 12/1995 | Hsu et al. . |
| 5,538,913 | 7/1996 | Hong . |
| 5,576,574 | 11/1996 | Hong ....................................... 257/408 |
| 5,658,811 | 8/1997 | Kimura et al. ........................... 438/289 |
| 5,688,700 | 11/1997 | Kao et al. . |
| 5,750,430 | 5/1998 | Son ......................................... 438/303 |

OTHER PUBLICATIONS

Bijan Davari, *CMOS Technology Scaling, 0.1 μm and Beyond*, 1996, IBM Semiconductor Research and Development Center, pp. 555–558.

Junko Tanaka et al., *A Sub–0.1–μM Grooved Gate MOSFET with High Immunity to Short–Channel Effects*, 1993, Central Research Laboratory, Hitachi, Ltd., pp. 537–540.

Chih–Yuan Lu et al., Process Limitation and Device Design Tradeoffs of Self–Aligned $TiSi_2$ Junction Formation in Submicrometer CMOS Devices, Feb. 1991, IEEE Transactions on Electron Devices, vol. 38, No. 2, pp. 246–254.

S.Y. Ueng et al., Superior Damage–Immunity of Thin Oxides Thermally Grown on Reactive–Ion–Etched Silicon Surface in $N_2O$ Ambient, May 1994, IEEE Transactions on Electron Devices, vol. 41, No. 5, pp. 850–851.

C.W. Chen et al., A Novel Self–Aligned TiN Formation by $N+_2$ Implantation During Two–Step Annealing Ti–Salicidation for Submicrometer CMOS Technology Application, Sep. 1994, IEEE Electron Device Letters, vol. 15, No. 9, pp. 339–341.

*Primary Examiner*—Richard A. Booth
*Attorney, Agent, or Firm*—Harness, Dickey & Pierce, P.L.C.

[57] ABSTRACT

An ultra-short channel MOSFET with the self-aligned silicided contact and the extended ultra-shallow source/drain junction is formed. An extremely short gate region can be defined without being limited with the bottleneck of the existed lithography technology. A good quality gate insulator layer forming from the regrowth of an oxynitride film is provided. A self aligned metal silicide process is performed to form the contacts. A disposable spacer structure is used to remove metal residue and thus the possible path for leakage is eliminated. An ultra shallow region is formed employing the metal silicide as a diffusion source. An extented source/drain region is provided.

22 Claims, 6 Drawing Sheets

METHOD OF MAKING ULTRA-SHORT CHANNEL MOSFET WITH SELF-ALIGNED SILICIDED CONTACT AND EXTENDED S/D JUNCTION

FIELD OF THE INVENTION

The present invention relates to the transistors in semiconductor manufacturing, and more specifically, to a method of forming a ultra-short channel MOSFET (metal oxide semiconductor field effect transistor) with self-aligned silicided contact and extended source/drain junction.

BACKGROUND OF THE INVENTION

From the birth of the first integrated circuit at 1960, the number of devices on a chip has grown in an explosive increasing rate. The progress of the semiconductor integrated circuits has step into ULSI (ultra large scale integration) level or even higher level after almost four decades of developments. The capacity of a single semiconductor chip increases from several thousand devices to hundreds of million devices, or even billions of devices. Integrated circuits devices like transistors, capacitors, and connections must be greatly narrowed accompanying with the advancement. The increasing packing density of integrated circuits generates numerous challenges to the semiconductor manufacturing process. Every element or device needs to be formed within smaller area without influencing the characteristics and the operations of the integrated circuits. The demands on high packing density, low heat generation, and low power consumption devices with a good reliability and a long operation life must be maintained without any degradation in the function. These achievements are expected to be reached with the simultaneous developments and advancements in the photography, the etching, the deposition, the ion implantation, and the thermal processing technologies, namely the big five key aspects of semiconductor manufacturing. The continuous increase in the packing density of the integration circuits must be accompanied with a shrinking minimum feature size. With present semiconductor manufacturing technology, the processes with a generally one-third micrometer in size is widely utilized. For making the next generation devices, the technologies focusing mainly on one-tenth micrometer or even nanometer sizes are highly demanded.

Transistors, or more particularly metal oxide semiconductor field effect transistors (MOSFET), are the most important and frequently employed devices in the integrated circuits with the high performance. However with the continuous narrowing of device size, the sub-micron scale MOS transistors have to face so many risky challenges. As the MOS transistors become narrower and thinner accompanying with shorter channels, problems like the junction punchthrough, the leakage, and the contact resistance, cause the reduction in the yield and reliability of the semiconductor manufacturing processes.

For developing future high speed ULSI circuits, the MOSFETs with an ultra-short channel, the self-aligned silicided contacts, and the extended ultra-shallow source/drain junction are required. In the article "CMOS Technology Scaling, 0.1 $\mu$m and Beyond" proposed by B. Davari (in IEDM Tech. Dig., p. 555, 1996 IEEE), a projection of CMOS technology scaling and the expected performance, density, and power improvements are presented. To scaling the CMOS technologies down to the sub one-tenth micrometer regime, significant improvements in the silicon chip performance must be addressed with the solution for the threshold voltage non-scalability, interconnect RC delays, increased soft error rate and power density. The five modules including the gate stack, the gate dielectric, the source/drain, the isolation and the channel profile are the key technology elements for deep sub-micrometer CMOS devices.

However, it is difficult to define the gate length to be below 0.1 $\mu$m due to the limitation of current optical lithography. The investigation of J. Tanaka et al. ("A Sub-0.1 $\mu$m Grooved Gate MOSFET with High Immunity to Short Channel effects", in IEDM Tech. Dig., p. 537, 1993 IEEE) disclosed that the phase-shifted lithography followed by the self-aligned side wall oxide film formation must be utilized to enable a spacing less than 0.1 $\mu$m for the gate.

The self-aligned silicidation technology is a vital application to improve the operation speed of the ULSI/VLSI MOS devices in manufacturing the sub-micron feature size semiconductor devices. Unfortunately, there exists some trade-offs in employing the technologies like self-aligned silicide. In general, the self-aligned silicidation process results a high junction leakage coming from the metal penetration. The metal penetration into the silicon substrate spikes the junction and/or the residual metal to cause the leakage problem. The silicide across the LDD spacer, which is not totally removed after the salicidation, causes the bridge between the adjacent devices like the gate and the source/drain regions. The detailed negative effects of the self-aligned silicidation technology on sub-micrometer devices are illustrated in the article of C. Y. Lu et al. ("Process Limitation and Device Design Tradeoffs of Self-Aligned TiSi$_2$ Junction Formation in Submicrometer CMOS Devices", in IEEE Trans. Electron Devices, vol. ED-38, No. 2, 1991) The device design tradeoffs for a shallow junction with a salicide structure is proposed. Process limitations of both junction formation schemes for sub-micrometer application and future scaling down are also established in the work.

SUMMARY OF THE INVENTION

A method combating the limitation of feature size at the present stage is provided with the accompanying solution to the aforementioned drawbacks of the self-aligned silicide technology. An ultra-short channel MOSFET with the self-aligned silicided contact and the extended ultra-shallow source/drain junction is formed by the method provided in the present invention. An extremely short gate region can be defined without being limited with the bottleneck of the existed lithography technology. The operation performance of the MOSFET is raised by a high quality gate insulator layer forming by the regrowth of an oxynitride film. The leakage risk induced from the metal silicide spiking is eliminated by the formation of a thin silicon layer, and the pretreatment of an nitrogen implantation. A lower leakage self-aligned silicide without the bridging effect between the devices is achieved by using a disposable spacer structure. An extended ultra-shallow source/drain junction solving the short channel effect can be achieved by using the low energy implant and an annealing process like the RTP annealing. A buried silicide contact is also realized. The aforementioned characteristics and the self-aligned silicide (salicide) technology employed in the present invention provides a reliable MOSFET a high operation speed with a low heat generation and a low power consumption. A reliable MOSFET for the densely packed integration circuits of the next generation semiconductors is manufactured.

The method of the present invention to form a transistor, more specifically a MOSFET, on a semiconductor includes the following steps. A pad insulator layer is formed over the semiconductor substrate and a stacked layer stacked over the pad insulator layer is formed. A photoresist layer is formed and defined with a gate region pattern over the stacked layer. A process for removing a portion of the stacked layer, using the gate region pattern defined on the photoresist layer, for having a hollow space in the stacked layer subsequently above the pad insulator layer is performed. A first spacer structure is formed on the side wall of the hollow space over the pad insulator layer for having a narrowed hollow space. A doping of an anti punchthrough region in the semiconductor substrate under the narrowed hollow space is then applied, with a first concentration of a first dopant type and using the first spacer structure and the stacked layer as a first doping mask.

A portion of the pad insulator layer under the narrowed hollow space is then removed to the semiconductor substrate to have an undercut structure under the first spacer structure and the stacked layer. Then a process for growing a regrown pad insulator layer on the semiconductor substrate under the narrowed hollow space and within the undercut structure is utilized. A silicon gate filling is formed to fill within the narrowed hollow space. The stacked layer and the first spacer structure are then removed. A step of forming a second spacer structure around a side wall portion of the silicon gate filling and located above the pad insulator layer is performed. A portion of the pad insulator layer is then removed for leaving a gate insulator layer under the second spacer structure and the silicon gate filling. The second spacer structure is also removed. A silicon layer is formed over the semiconductor substrate covering with the silicon gate filling and the gate insulator layer.

A third spacer structure is then formed on a side wall portion of the silicon layer. A process for doping a third concentration of a third dopant type to the silicon layer and the third spacer structure is performed. A metal layer is formed on the silicon layer and the third spacer structure. A first thermal annealing is performed to the semiconductor substrate to form a metal silicide layer on a top surface of the silicon layer, and to leave an unreacted metal layer on the third spacer structure. A third concentration of a third dopant type is doped into the semiconductor substrate, to place a plurality of third type ions, for forming a heavily doped source region and a heavily doped drain region in the semiconductor substrate under a region uncovered by the third spacer structure and the gate insulator layer. The semiconductor substrate is then subjected to a second thermal annealing to stable the metal silicide layer, and to activate the plurality of third type ions into the heavily doped source region and the heavily doped drain region. The unreacted metal layer and the third spacer structure are removed. A portion of the silicon layer locating above the gate insulator layer is also removed to leave a remaining portion of the silicon layer to combine with the silicon gate filling for forming a gate structure. A step for doping a fourth concentration of a fourth dopant type to the semiconductor substrate is employed to form an extended shallow junction region containing a plurality of fourth type ions, in the semiconductor substrate under a region uncovered by the metal silicide layer and the gate structure. An insulator layer is formed over the metal silicide layer, the gate insulator layer, and the gate structure. The semiconductor substrate is subjected to a third thermal annealing to activate the plurality of fourth type ions in the extended shallow junction region. Finally, a metalization process is utilized to form a set of connections to the gate structure, the heavily doped source region, and the heavily doped drain region on the semiconductor substrate.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming an ultra-short channel MOSFET with a self-aligned silicided contact and an extended ultra-shallow source/drain junction is provided in the present invention. An extremely short gate region can be defined through the formation of a spacer structure. A high quality gate insulator layer can be formed by the regrowth of an oxynitride film being grown from the semiconductor substrate. The leakage risk induced from the spiking of the metal silicide into the semiconductor substrate is eliminated by the formation of a thin silicon layer and an ion implantation pretreatment. A low leakage self-aligned silicide without the bridging effect between the devices is formed by using a disposable spacer structure. An extended ultra-shallow source/drain junction solving the short channel effect can be achieved by using the low energy implant and an annealing process like the RTP annealing. A buried silicide contact is also realized. The hot carrier effect can be eliminated. The self-aligned silicide (salicide) technology employed in the present invention for forming the connections with low RC delays provides a high operation speed with a low heat generation and a low power consumption. The method of forming an ultra-short channel MOSFET with self-aligned silicided contact and extended ultra-shallow source/drain junction is described as following.

Figure 1:
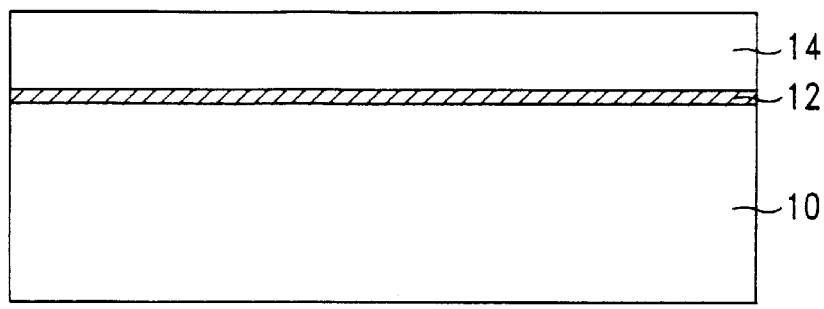
FIG. 1 illustrates a cross sectional view of the formation of a pad insulator layer and a stacked layer on the semiconductor substrate in the present invention.

The method and the steps in the present invention applied on a semiconductor wafer can create different types of transistors like the NMOS and the PMOS transistors with a greater number of devices at a time. For a clear illustration, the steps for forming a single NMOS transistors are illustrated. The PMOS transistors can also be build applying the similar method. Since the variations in the processes for incorporating the formation of the PMOS transistors are well known in the art, the details are not described. Referring to FIG. 1, a semiconductor substrate 10 with a preferable single crystalline silicon in a <100> direction is provided. A pad insulator layer 12, like a thin silicon oxide layer 12 is formed. The thin oxide layer 12 is thermally grown on the semiconductor substrate 10 with the thickness in the range of about 20 angstroms to 400 angstroms. A stacked layer 14 stacked over the pad insulator layer is then formed. The stacked layer 14 like a silicon nitride layer 14 deposited with a thickness of about 1000 angstroms to 2500 angstroms can be employed.

Figure 2:
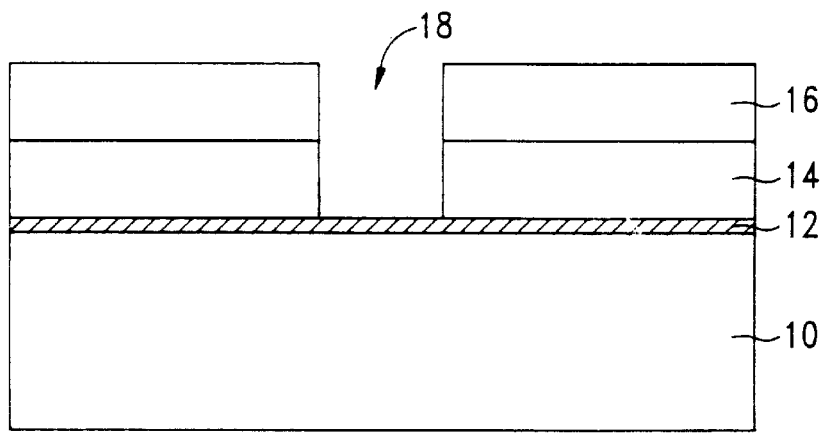
FIG. 2 illustrates a cross sectional view of the formation of a photoresist layer with a defined pattern and the hollow space in the stacked layer on the semiconductor substrate in the present invention.
Figure 3:
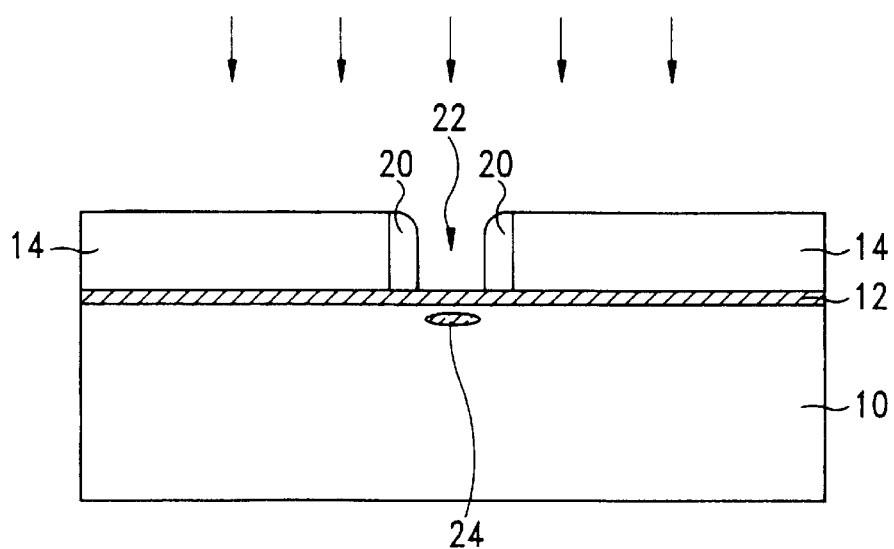
FIG. 3 illustrates a cross sectional view of the formation of a first spacer structure and the doping process on the semiconductor substrate in the present invention.
Figure 4:
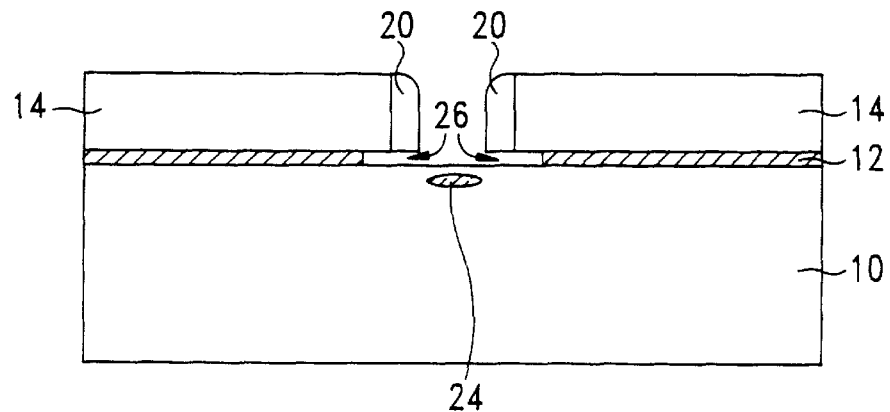
FIG. 4 illustrates a cross sectional view of the removing of part of the pad insulator layer on the semiconductor substrate in the present invention.

A lithography process is then applied to form and pattern a photoresist layer 16 for defining a gate region, as shown in FIG. 2. The silicon nitride layer 14 is then etched to have a hollow space 18 subsequently above the thin silicon oxide layer 12. The etchants like $CCl_2F_2$, $CHF_3$, $CF_4/O_2$, $CF_4/H_2$, $CHF_3$ and $CH_3CHF_2$ can be applied in etching the defined gate region in the silicon nitride layer 14. A first spacer structure 20 is then formed on the side wall of the hollow space 18 over the thin silicon oxide layer 12 for having a narrowed hollow space 22. In the case, the first spacer structure 20 is formed by sequentially performing a depositing and an etching back of a silicon nitride layer, through a self-aligned process without utilizing a lithography process. With the above process, a definition of the narrowed hollow space as the gate width narrower than the limitation of the present lithography process is achieved. For example, if the minimum gate width defined by the lithography process is 0.1 micrometer, the size or width of the narrowed hollow space can be much narrower, and can be controlled well by adjusting the thickness of the first spacer structure 20.

Still referring to FIG. 2, a punchthrough stopping implant region 24 is formed by the doping, like an ion implantation process, of first type dopants. For forming the NMOS transistors, a boron or $BF_2$ containing dopant implanted at an energy between about 5 KeV to 100 KeV to have a dose between about 1E11 to 1E14 atoms/cm$^2$ is employed to prevent a punchthrough effect in the channel under the gate region. For forming a PMOS transistor, the ion implantation with boron or $BF_2$ containing ions can be substituted with a arsenic or phosphorous containing ions.

Figure 5:
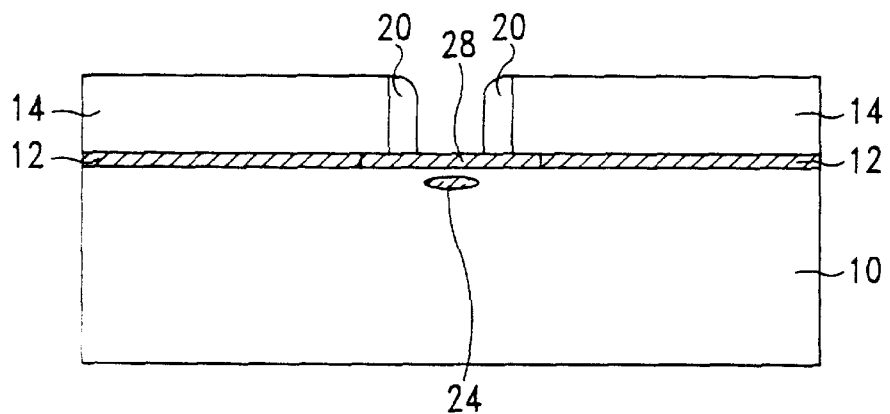
FIG. 5 illustrates a cross sectional view of the formation of a regrown pad insulator layer on the semiconductor substrate in the present invention.

Following with the anti punchthrough implantation, a portion of the thin silicon oxide layer 12 under the narrowed hollow space 22 is removed to have the undercut holes or an undercut structure 26 under the first spacer structure 20 and the stacked layer 14. An wet etching process using etchants like the hydrofluoric acid with a buffer agent of ammonium fluoride can be applied. A regrown pad insulator layer 28 with a thickness of about 20 angstroms to 400 angstroms is then formed under the narrowed hollow space 22 and within the undercut structure 26 on the semiconductor substrate 10 to fill the etched space, as shown in FIG. 5. For a good quality of the regrown pad insulator layer 28, a thin oxynitride film thermally grown in a nitrogen and oxygen containing gas ambient, like $N_2O$, is used to replace the original thin silicon oxide layer 12. The superior quality and effect of the thin oxynitride film as a gate insulator layer have been investigated in details in the publications. An investigation of "Superior Damage-Immunity of Thin Oxides Thermally Grown on Reactive-Ion-Etched Silicon Surfaces in $N_2O$ Ambient" made by S. Y. Ueng et al. (in IEEE Trans. Electron Devices, vol. ED-41 No.5, 1994) is an example. The thin oxides thermally grown on reactive-ion-etched (RIE) silicon surfaces in $N_2O$ ambient have been studied. A great improvement in both the time-zero-dielectric-breakdown (TZDB) and the time-zero-dependent-breakdown (TDDB) characteristics is observed for the $N_2O$ grown oxides on (RIE)-treated silicon surfaces. A longer life time under accelerated tests is also found.

Figure 6:
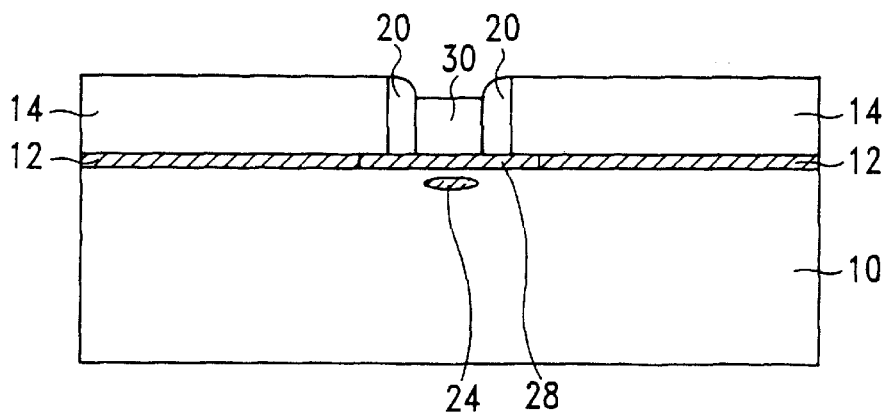
FIG. 6 illustrates a cross sectional view of the formation of a silicon gate filling within a narrowed hollow space on the semiconductor substrate in the present invention.

Referring to FIG. 6, a silicon gate filling 30 is formed to fill within the narrowed hollow space 22. The formation of the silicon gate filling 30 can be achieved by depositing a silicon layer on the semiconductor 10 and then by an etching process to remove the portion on top of the stacked layer 14. As an example, the process like a low pressure chemical deposition (LPCVD) process can be used in forming the silicon layer. Then an etching process is performed to form the silicon gate filling 30 can be done by the method like an anisotropic etching using an etchant within the great variety of choices like $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$. The width of the silicon gate filling 30, which is determined by the thickness of the first spacer structure 20, can be formed with about 0.3 micrometer to as narrow as about 0.1 micrometer.

Figure 7:
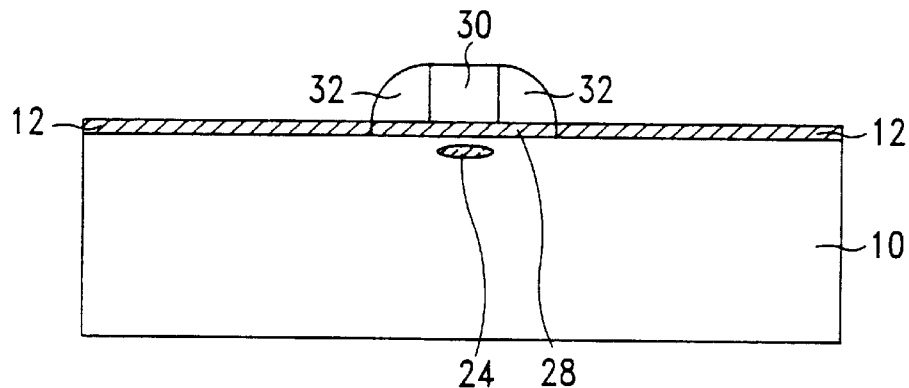
FIG. 7 illustrates a cross sectional view of the formation of a second spacer around a side wall portion of the silicon gate filling on the semiconductor substrate in the present invention.

A removing process like an etching process using etchants like $CCl_2F_2$, $CHF_3$, $CF_4$, $CF_4/O_2$, $CF_4/H_2$, $CHF_3$, $CH_3CHF_2$ is then performed to remove the first spacer structure 20 and the silicon nitride layer 14, using the pad insulator layer 12 as an etch stop layer, after the formation of the silicon gate filling 30, as shown in FIG. 7. A second spacer structure 32, located above the pad insulator layer 12, is then formed around the side wall portion of the silicon gate filling. The same as the first spacer structure 20, the second spacer structure 32 is formed by sequentially performing a depositing and an etching back of a silicon nitride layer, through a selfaligned process without utilizing a lithography process.

Figure 8:
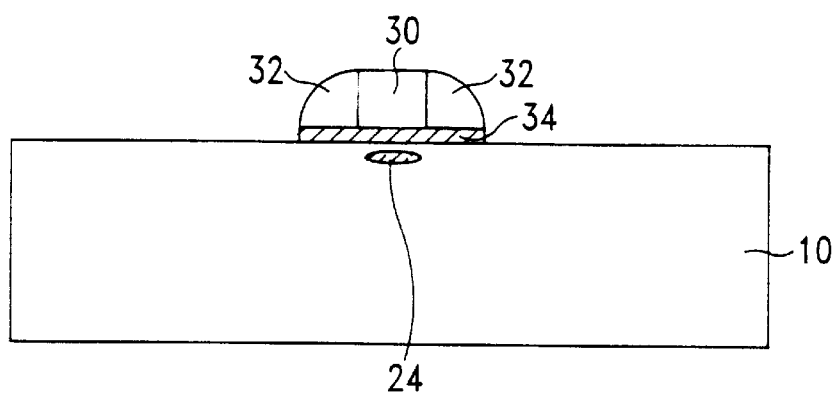
FIG. 8 illustrates a cross sectional view of the removing of part of the pad insulator layer on the semiconductor substrate in the present invention.

A portion of the thin silicon oxide layer 12 uncovered by the second spacer structure 32 and the silicon gate filling 30 is then removed, as shown in FIG. 8. A process like an anisotropic reactive ion etching (RIE) can be used with reaction gases like $CF_4$, $CCl_2F_2$, $CHF_3/CF_4$, $CHF_3/O_2$ and $CH_3CHF_2$. The second spacer structure 32 and the silicon gate filling 30 are used as the etching mask in the process.

The remaining portion of the thin silicon oxide layer 12 and the regrown pad insulator layer 28 are combined as a gate insulator layer 34.

Figure 9:
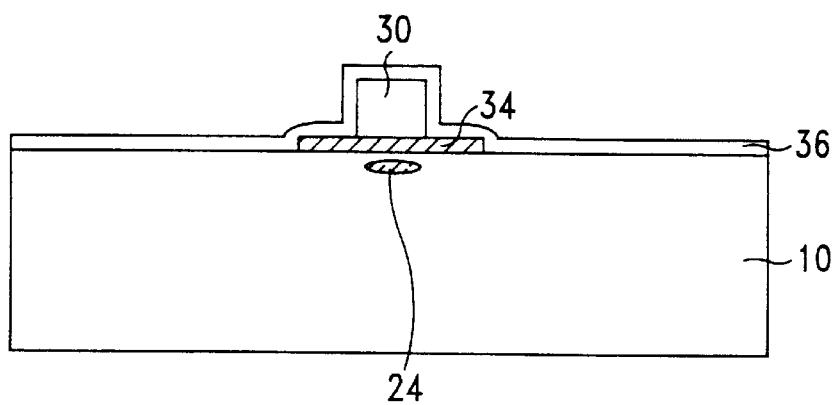
FIG. 9 illustrates a cross sectional view of the formation of a silicon layer on the semiconductor substrate in the present invention.

Referring to FIG. 9, the second spacer structure 32 is removed after finishing it's function as an etching mask. Etchants like $CCl_2F_2$, $CHF_3$, $CF_4$, $CF_4/O_2$, $CF_4/H_2$, $CHF_3$, $CH_3CHF_2$ can be used to etch the second spacer structure 32. A thin silicon layer 36 is then formed over the semiconductor substrate 10. The thin silicon layer 36 formed by depositing an undoped amorphous silicon layer conformal with the silicon gate filling 30 and the gate insulator layer 34 with a thickness between about 300 angstroms and 2500 angstroms. The ultra-thin and undoped amorphous silicon layer 36 is uses as a buffer layer for later self-aligned silicidation processes to prevent the salicide spiking effect.

Figure 10:
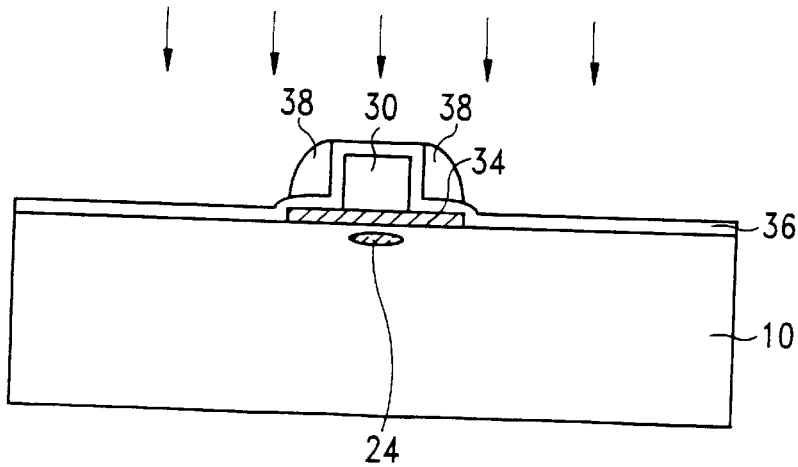
FIG. 10 illustrates a cross sectional view of the formation of a third spacer on the side wall portion of the silicon layer on the semiconductor substrate in the present invention.

A third spacer structure 38 is then formed on a side wall portion of the silicon layer as an anti salicidation bridging spacer structure, as shown in FIG. 10. The same as the first spacer structure 20 and the second spacer structure 32, the third spacer structure 38 is formed by sequentially performing a depositing and an etching back of a silicon nitride layer, through a self-aligned process without utilizing a lithography process. A doping process is then performed. An ion implantation of ions like nitrogen ions is performed to the thin silicon layer 36 on the semiconductor substrate 10, at an energy between about 5 KeV to 100 KeV at a dose between about 5E13 to 5E16 atoms/cm$^2$. The thin silicon layer 36 after the treatment of the nitrogen ion implantation can have a positive effect on the later self-aligned silicidation processes. For a detail understanding of the effects, an investigation of C.W. Chen et al. ("A Novel Self-Aligned TiN Formation by $N_2^+$ Implantation During Two-Step Annealing Ti-Salicidation for Submicrometer CMOS Technology Application" in IEEE Electron Device Letters, Vol. 15, No.9, P. 339, 1994) can be referenced. A new technology of self-aligned TiN/TiSi2 formation using $N_2^+$ implantation during two-step annealing Ti-salicidation process is developed. An Al/TiN/TiSi$_2$ contact is formed. The TiN layer formed with the technology proposed is suggested as a very effective barrier layer between TiSi$_2$ and Al for submicrometer CMOS technology applications.

Figure 11:
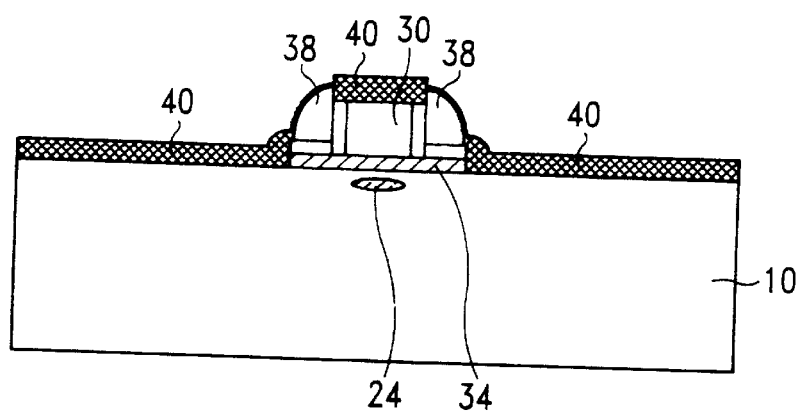
FIG. 11 illustrates a cross sectional view of the formation of a metal silicide layer on the semiconductor substrate in the present invention.
Figure 12:
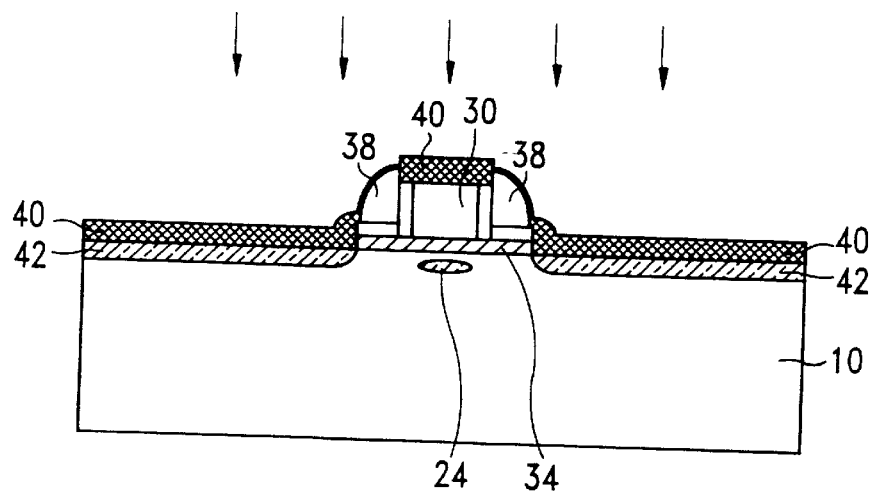
FIG. 12 illustrates a cross sectional view of the doping of a third concentration of a third dopant type to the semiconductor substrate to place a plurality of third type ions to form a heavily doped source region and a heavily doped drain region on the semiconductor substrate in the present invention.

A self-aligned silicide (salicide) technology is utilized to form the contacts. A metal layer is formed on the semiconductor substrate using the method like a chemical vapor deposition or a sputtering process generally with a thickness of about 100 angstroms to 1500 angstroms. A metal material like Ti, Co, W, and Pt can be used. Then a first step anneal, preferably a rapid thermal process with a temperature of about 350° C. to 700° C., is performed to the semiconductor substrate 10. A metal silicide layer 40 is formed on the top surface of the thin silicon layer 36 uncovered by the third spacer structure 38, by the reaction of the metal layer and the thin silicon layer 36, as shown in FIG. 11. An unreacted metal layer 42 is left on the third spacer structure 38. Referring to FIG. 12, a doping is then applied to the semiconductor substrate 10 for forming a heavily doped source/drain region 42 in the semiconductor substrate 10. The silicon gate filling 30 and the thin silicon layer 36 surrounding the gate filling 30 are also doped to be highly conductive. Using the third spacer structure 38 as a mask, a process like an ion implantation of arsenic or phosphorous containing ions at an energy between about 10 KeV to 150 KeV, to have a dose between about 5E14 to 5E16 atoms/cm$^2$ is employed. For forming a PMOS transistor, the ion implantation with arsenic or phosphorous containing ions can be substituted with a boron or BF$_2$ containing ions. One part of the ions are implanted into through the metal silicide layer 40, the other part of the ions are left in the metal silicide layer 40 and can be driven in by the process followed. An ultra shallow source/drain region is formed by the ion implantation through the the metal silicide layer. A second step anneal is then performed to the semiconductor substrate to drive in and activate the containing ions in the heavily doped source/drain region 42. A thermal process like a rapid thermal process (RTP) can be employed with a temperature between about 700° C. to 1000° C. and the metal silicide layer 40 is also stabled and the sheet resistance between the silicon/metal interface is also reduced through the process. The ultra-shallow, heavily doped source/drain region 42 is activated through the annealing.

Figure 13:
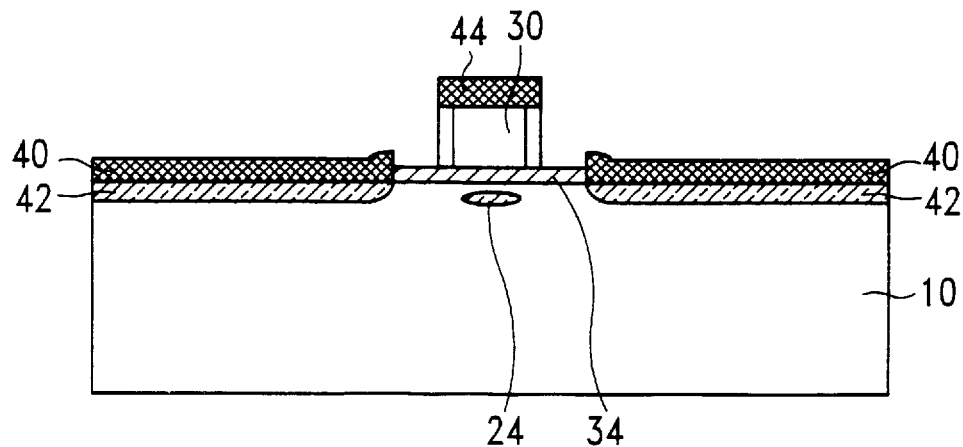
FIG. 13 illustrates a cross sectional view of the removing of the unreacted metal layer and the third spacer structure on the semiconductor substrate in the present invention.
Figure 14:
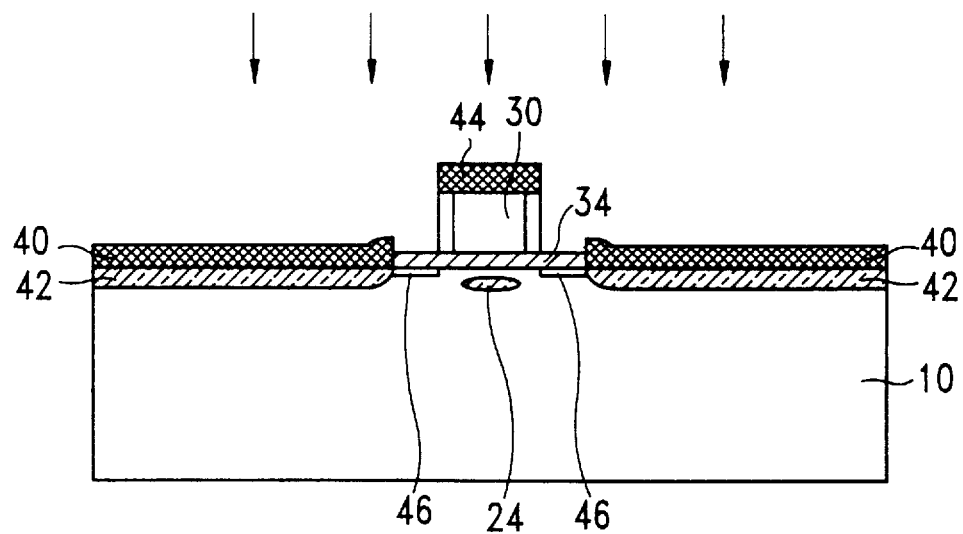
FIG. 14 illustrates a cross sectional view of the doping of a fourth concentration of a fourth dopant type to the semiconductor substrate to form an extended shallow junction region in the present invention.
Figure 15:
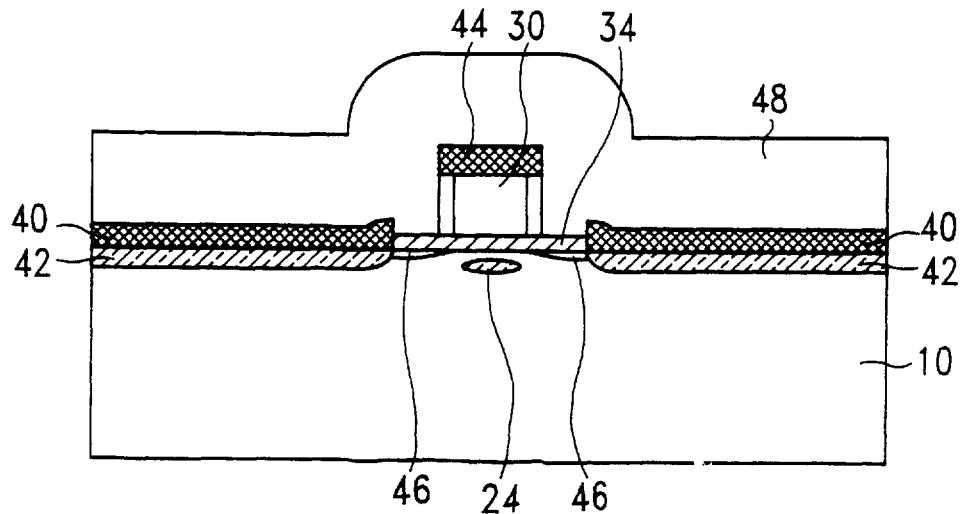
FIG. 15 illustrates a cross sectional view of the formation of an insulator layer on the semiconductor substrate in the present invention.
Figure 16:
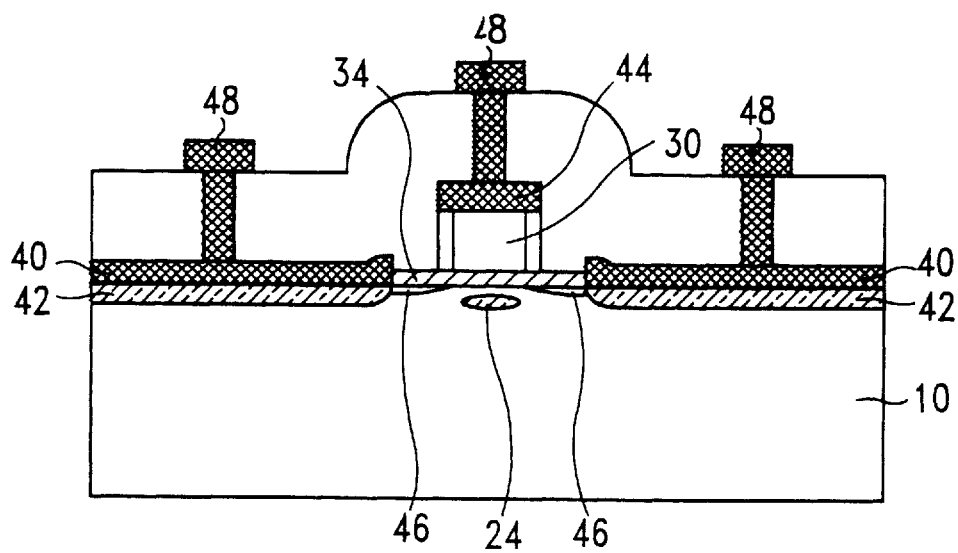
FIG. 16 illustrates a cross sectional view of a metalization process performed on the semiconductor substrate in the present invention.

The third spacer structure 38 is then removed and the aforementioned etchants like $CCl_2F_2$, $CHF_3$, $CF_4$, $CF_4/O_2$, $CF_4/H_2$, $CHF_3$, $CH_3CHF_2$ can be used. The unreacted metal layer on the third spacer structure is also removed at the same time, as shown in FIG. 13. A portion of the unreacted thin silicon layer under the third spacer is also removed using the process like an anisotropic etching, preferably a reactive ion etching (RIE). The remaining portion of the thin silicon layer 36 combines with the silicon gate filling 30 to form a gate structure 44. The risk of bridging through the conductive material left on the spacer structure can be effetely reduced, by the accompanying the removal of the unreacted metal layer. With the disposing of the third spacer structure 38, a portion of the gate insulator layer 34 around the gate filling 30 is exposed. The semiconductor substrate 10 is subjected to a low energy ion implantation of arsenic or phosphorous ions containing at an energy between about 0.1 KeV to 20 KeV, to have a dose between about 2E13 to 2E15 atoms/cm$^2$. With the low energy implantation through the exposed portion of the gate insulator layer 34 to the semiconductor substrate 10, an extended source/drain region 46 is formed under, as shown in FIG. 14. For forming a PMOS transistor, the low energy ion implantation with arsenic or phosphorous containing ions can be substituted with a boron containing ions.

An insulator layer 48 like a chemically vapor deposited (CVD) silicon oxide layer with a thickness between about 2000 angstroms to 10000 angstroms is formed over the semiconductor substrate 10 and is conformal with the metal silicide layer 40, the gate insulator layer 34, and the gate structure 44. The ions in the extended source/drain region 46 are then driven in to redistribute and to activate the extended source/drain region 46 by an annealing process. In the case, an aforementioned RTP process with a temperature of about 700° C. to 1050° C. is used. The contact insulator layer 48 of CVD oxide is condensed for a better quality and uniformity during the annealing. A metalization process, which is well known in the art, is performed finally on the semiconductor substrate 10 for forming the interconnections 48 to the contacts of the gate structure 30 and the heavily doped source/drain region 42.

An ultra-short channel MOSFET with the self-aligned silicided contact and the extended ultra-shallow source/drain junction is formed by the method provided in the present invention. Through the first spacer structure 20, an extremely short gate region can be defined out of the limitation of the present lithography technology. The operation performance of the MOSFET is raised by a high quality gate insulator layer formed by the regrowth of an oxynitride film. The leakage risk induced from the metal silicide spiking is eliminated by the formation of a thin silicon layer and the pretreatment an nitrogen implantation. A lower leakage selfaligned silicide without the bridging effect between the devices is achieved by using a disposable spacer structure. An extended ultra-shallow source/drain junction solving the short channel effect can be achieved by using the low energy implant and an annealing process like the RTP annealing. A buried silicide contact is also realized. The aforementioned characteristics and the self-aligned silicide (salicide) technology employed in the present invention provides a reliable MOSFET a high operation speed with a low heat generation and a low power consumption.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a transistor in a semiconductor substrate, said method comprising the steps of:

forming a pad insulator layer over said semiconductor substrate;

forming a stacked layer stacked over said pad insulator layer;

forming a photoresist layer defined with a gate region pattern over said stacked layer;

removing a portion of said stacked layer, using said gate region pattern defined on the photoresist layer, for having a hollow space having side walls in said stacked layer subsequently above said pad insulator layer;

forming a first spacer structure on the side walls of said hollow space over said pad insulator layer for having a narrowed hollow space;

doping an anti punchthrough region of said semiconductor substrate under said narrowed hollow space with a first concentration of a first dopant, using said first spacer structure and said stacked layer as a first doping mask;

removing a portion of said pad insulator layer under said narrowed hollow space to said semiconductor substrate and to have an undercut structure under said first spacer structure and said stacked layer;

forming a regrown pad insulator layer on said semiconductor substrate under said narrowed hollow space and within said undercut structure;

forming a silicon gate filling to fill within said narrowed hollow space;

removing said stacked layer and said first spacer structure;

forming a second spacer structure around a side wall portion of said silicon gate filling;

removing a portion of said pad insulator layer for leaving a gate insulator layer under said second spacer structure and said silicon gate filling;

removing said second spacer structure;

forming a silicon layer over said semiconductor substrate, said silicon layer being conformal with said silicon gate filling and said gate insulator layer;

forming a third spacer structure on a side wall portion of said silicon layer;

doping a second concentration of a second dopant to said silicon layer and said third spacer structure;

forming a metal layer on said silicon layer and said third spacer structure;

performing a first thermal annealing to said semiconductor substrate to form a metal silicide layer on a top surface of said silicon layer, and to leave an unreacted metal layer on said third spacer structure;

doping a third concentration of a third dopant to said semiconductor substrate for forming a heavily doped source region and a heavily doped drain region in said semiconductor substrate under a region uncovered by said third spacer structure and said gate insulator layer;

performing a second thermal annealing to said semiconductor substrate to stabilize said metal silicide layer, and to activate said concentration of third dopant in said heavily doped source region and said heavily doped drain region;

removing said unreacted metal layer and said third spacer structure;

removing a portion of said silicon layer located under said third spacer structure, to leave a remaining portion of said silicon layer combining with said silicon gate filling for forming a gate structure;

doping a fourth concentration of a fourth dopant to said semiconductor substrate, to form an extended shallow junction region containing said fourth dopant, in said semiconductor substrate under a region uncovered by said metal silicide layer and said gate structure;

forming an insulator layer over said metal silicide layer, said gate insulator layer, and said gate structure;

performing a third thermal annealing to said semiconductor substrate to activate said fourth dopant in said extended shallow junction region; and performing a metalization process on said semiconductor substrate to form a set of connections to said gate structure, said heavily doped source region, and said heavily doped drain region.

2. The method of claim 1, wherein said pad insulator layer comprises a silicon oxide layer which is grown thermally in an oxygen ambient on said semiconductor substrate to a thickness of about 20 angstroms to 400 angstroms.

3. The method of claim 1, wherein said regrown pad insulator layer comprises an oxynitride layer, said oxynitride layer being grown from said semiconductor substrate in a nitrogen and oxygen containing ambient with a thickness of about 20 angstroms to 400 angstroms.

4. The method of claim 1, wherein said stacked layer comprises a silicon nitride layer deposited with a thickness of about 1000 angstroms to 2500 angstroms.

5. The method of claim 1, wherein said first spacer structure, said second spacer structure, and said third spacer structure are formed by sequentially performing a depositing and an etching back of a silicon nitride layer.

6. The method of claim 1, wherein said first dopant is a boron containing dopant, and said third dopant and fourth dopant being selected from the group consisting of an arsenic containing dopant and a phosphorous containing dopant.

7. The method of claim 6, wherein said doping with a first concentration of a first dopant is performed with a first ion implanting process at an energy between about 5 KeV to 100 KeV to have a dose between about 1E11 to 1E14 atoms/cm$^2$ to prevent an anti punchthrough effect, said doping with a third concentration of a third dopant is performed with a third ion implanting process at an energy between about 10 KeV to 150 KeV to have a dose between about 5E14 to 5E16 atoms/cm$^2$ for forming for forming said heavily doped source region and said heavily doped drain region, and said doping with a fourth concentration of a fourth dopant is performed with a fourth ion implanting process at an energy between about 0.1 KeV to 20 KeV to have a dose between about 2E13 to 2E15 atoms/cm$^2$ to form said extended shallow junction region.

8. The method of claim 1, wherein said first dopant is selected from the group consisting of an arsenic containing dopant and a phosphorous containing dopant, and said third dopant and fourth dopant being a boron containing dopant.

9. The method of claim 8, wherein said doping with a first concentration of a first dopant is performed with a first ion implanting process at an energy between about 5 KeV to 100 KeV to have a dose between about 1E11 to 1E14 atoms/cm$^2$ to prevent an anti punchthrough effect, said doping with a third concentration of a third dopant is performed with a third ion implanting process at an energy between about 10 KeV to 150 KeV to have a dose between about 5E14 to 5E16 atoms/cm$^2$ for forming said heavily doped source region and said heavily doped drain region, and said doping with a fourth concentration of a fourth dopant is performed with a fourth ion implanting process at an energy between about 0.1 KeV to 20 KeV to have a dose between about 2E13 to 2E15 atoms/cm$^2$ to form said extended shallow junction region.

10. The method of claim 1, wherein said silicon layer comprises a layer of undoped amorphous silicon layer formed by a chemical vapor deposition process.

11. The method of claim 1, wherein said doping a second concentration of second dopant is performed with a nitrogen implantation process being implanted at an energy between about 5 KeV to 100 KeV at a dose between about 5E13 to 5E16 atoms/cm$^2$.

12. The method of claim 1, wherein said metal layer comprises a metal selected from the group consisting of Ti, Co, W, Ni and Pt.

13. A method of forming a transistor in a semiconductor substrate, said method comprising the steps of:

forming a pad insulator layer over said semiconductor substrate;

forming a stacked layer stacked over said pad insulator layer;

forming a photoresist layer defined with a gate region pattern over said stacked layer;

removing a portion of said stacked layer, using said gate region pattern defined on the photoresist layer, for having a hollow space having side walls in said stacked layer subsequently above said pad insulator layer;

forming a first spacer structure on the side walls of said hollow space over said pad insulator layer for having a narrowed hollow space;

doping an anti punchthrough region of said semiconductor substrate under said narrowed hollow space with a first concentration of a first dopant, using said first spacer structure and said stacked layer as a first doping mask;

removing a portion of said pad insulator layer under said narrowed hollow space to said semiconductor substrate and to have an undercut structure under said first spacer structure and said stacked layer;

forming a regrown pad insulator layer on said semiconductor substrate under said narrowed hollow space and within said undercut structure, said regrown pad insulator layer comprising an oxynitride layer being grown from said semiconductor substrate in a nitrogen and oxygen containing ambient;

forming a silicon gate filling to fill within said narrowed hollow space;

removing said stacked layer and said first spacer structure;

forming a second spacer structure around a side wall portion of said silicon gate filling;

removing a portion of said pad insulator layer for leaving a gate insulator layer under said second spacer structure and said silicon gate filling;

removing said second spacer structure;

forming a silicon layer over said semiconductor substrate, said silicon layer being conformal with said silicon gate filling and said gate insulator layer, said silicon layer comprises a thin layer of undoped amorphous silicon layer formed by a chemical vapor deposition process;

forming a third spacer structure on a side wall portion of said silicon layer;

doping a second concentration of a second dopant to said silicon layer and said third spacer structure, said doping being performed with an ion implantation process with nitrogen containing ions;

forming a metal layer on said silicon layer and said third spacer structure, said metal layer comprising a metal selected from the group consisting of Ti, Co, W, Ni, and Pt;

performing a first thermal annealing to said semiconductor substrate to form a metal silicide layer on a top surface of said silicon layer, and to leave an unreacted metal layer on said third spacer structure;

doping a third concentration of a third dopant to said semiconductor substrate for forming a heavily doped source region and a heavily doped drain region in said semiconductor substrate under a region uncovered by said third spacer structure and said gate insulator layer;

performing a second thermal annealing to said semiconductor substrate to stabilize said metal silicide layer, and to activate said third concentration of third dopant in said heavily doped source region and said heavily doped drain region;

removing said unreacted metal layer and said third spacer structure;

removing a portion of said silicon layer located under said third spacer structure, to leave a remaining portion of said silicon layer combining with said silicon gate filling for forming a gate structure;

doping a fourth concentration of a fourth dopant to said semiconductor substrate, to form an extended shallow junction region containing said fourth concentration of said fourth dopant, in said semiconductor substrate under a region uncovered by said metal silicide layer and said gate structure;

forming an insulator layer over said metal silicide layer, said gate insulator layer, and said gate structure;

performing a third thermal annealing to said semiconductor substrate to activate said fourth concentration of fourth dopant in said extended shallow junction region; and performing a metalization process on said semiconductor substrate to form a set of connections to said gate structure, said heavily doped source region, and said heavily doped drain region.

14. The method of claim 13, wherein said pad insulator layer comprises a silicon oxide layer which is grown thermally in an oxygen ambient on said semiconductor substrate to a thickness of about 20 angstroms to 400 angstroms.

15. The method of claim 13, wherein said oxynitride layer, said oxynitride layer has a thickness of about 20 angstroms to 400 angstroms.

16. The method of claim 13, wherein said stacked layer comprises a silicon nitride layer deposited with a thickness of about 1000 angstroms to 2500 angstroms.

17. The method of claim 13, wherein said first spacer structure, said second spacer structure, and said third spacer structure are formed by sequentially performing a depositing and an etching back of a silicon nitride layer.

18. The method of claim 13, wherein said first dopant is a boron containing dopant, and said third dopant and fourth dopant being selected from the group consisting of an arsenic containing dopant and a phosphorous containing dopant.

19. The method of claim 18, wherein said doping with a first concentration of a first dopant is performed with a first ion implanting process at an energy between about 5 KeV to 100 KeV to have a dose between about 1E11 to 1E14 atoms/cm$^2$ to prevent an anti punchthrough effect, said doping with a third concentration of a third dopant is performed with a third ion implanting process at an energy between about 10 KeV to 150 KeV to have a dose between about 5E14 to 5E16 atoms/cm$^2$ for forming said heavily doped source region and said heavily doped drain region, and said doping with a fourth concentration of a fourth dopant is performed with a fourth ion implanting process at an energy between about 0.1 KeV to 20 KeV to have a dose between about 2E13 to 2E15 atoms/cm$^2$ to form said extended shallow junction region.

20. The method of claim 13, wherein said first dopant is selected from the group consisting of an arsenic containing dopant and a phosphorous containing dopant, and said third dopant and fourth dopant being a boron containing dopant.

21. The method of claim 20, wherein said doping with a first concentration of a first dopant is performed with a first ion implanting process at an energy between about 5 KeV to 100 KeV to have a dose between about 1E11 to 1E14 atoms/cm$^2$ to prevent an anti punchthrough effect, said doping with a third concentration of a third dopant is performed with a third ion implanting process at an energy between about 10 KeV to 150 KeV to have a dose between about 5E14 to 5E16 atoms/cm$^2$ for forming for forming said heavily doped source region and said heavily doped drain region, and said doping with a fourth concentration of a fourth dopant is performed with a fourth ion implanting process at an energy between about 0.1 KeV to 20 KeV to have a dose between about 2E13 to 2E15 atoms/cm$^2$ to form said extended shallow junction region.

22. The method of claim 13, wherein said ion implantation with nitrogen containing ions is implanted at an energy between about 5 KeV to 100 KeV at a dose between about 5E13 to 5E16 atoms/cm$^2$.

* * * * *